(12) United States Patent
Darvishi

(10) Patent No.: US 11,909,370 B2
(45) Date of Patent: Feb. 20, 2024

(54) ELECTRONIC DEVICES WITH DIFFERENTIAL LC FILTERS

(71) Applicant: Apple Inc., Cupertino, CA (US)

(72) Inventor: Milad Darvishi, San Diego, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/831,261

(22) Filed: Jun. 2, 2022

(65) Prior Publication Data

US 2023/0396226 A1 Dec. 7, 2023

(51) Int. Cl.
*H03H 7/01* (2006.01)
*H03H 1/00* (2006.01)
*H03H 2/00* (2006.01)

(52) U.S. Cl.
CPC .......... *H03H 7/0115* (2013.01); *H03H 2/006* (2013.01); *H03H 2/008* (2013.01); *H03H 1/0007* (2013.01); *H03H 2001/0014* (2013.01); *H03H 2218/12* (2013.01)

(58) Field of Classification Search
CPC .......................... H03H 7/0115; H03H 1/0007
USPC .................................................. 333/175, 185
See application file for complete search history.

(56) References Cited

U.S. PATENT DOCUMENTS

| | | | |
|---|---|---|---|
| 7,031,689 B2 * | 4/2006 | Frank | H04B 1/40 455/333 |
| 7,415,286 B2 | 8/2008 | Behzad | |
| 7,697,915 B2 | 4/2010 | Behzad et al. | |
| 8,050,318 B2 | 11/2011 | Phanse et al. | |
| 8,536,939 B2 | 9/2013 | Shibata et al. | |
| 8,604,879 B2 | 12/2013 | Mourant et al. | |
| 10,128,819 B2 | 11/2018 | Hedayati et al. | |
| 10,211,865 B1 | 2/2019 | Miller et al. | |
| 11,206,006 B2 | 12/2021 | Bagga | |
| 2008/0094153 A1 * | 4/2008 | Wang | H03H 7/427 333/177 |
| 2008/0195180 A1 * | 8/2008 | Stevenson | A61N 1/05 607/60 |
| 2022/0393574 A1 * | 12/2022 | Pervaiz | H02M 3/33592 |

* cited by examiner

*Primary Examiner* — Rakesh B Patel
(74) *Attorney, Agent, or Firm* — Treyz Law Group; Jason Tsai

(57) ABSTRACT

An electronic device may include wireless circuitry having an LC filter. The LC filter may include first and second series inductors coupled between the input and output of the LC filter. An input capacitor can be coupled at the input of the LC filter, and an output capacitor can be coupled at the output of the LC filter. Feedforward capacitors can be cross-coupled with the first and second series inductors to at least partially or fully cancel out any parasitic capacitance associated with the first and second series inductors to mitigate any undesired self-resonant effects associated with the series inductors.

19 Claims, 7 Drawing Sheets

ELECTRONIC DEVICES WITH DIFFERENTIAL LC FILTERS

FIELD

This disclosure relates generally to electronic devices and, more particularly, to electronic devices with wireless circuitry.

BACKGROUND

Electronic devices are often provided with wireless capabilities. An electronic device with wireless capabilities has wireless circuitry that includes one or more antennas. A transmitter in the wireless circuitry uses the antennas to transmit wireless signals. A receiver in the wireless circuitry receives wireless signals from the antennas.

The wireless circuitry can include a baseband processor that generates baseband signals. The baseband signals are fed through a baseband filter prior to being up-converted to radio-frequency signals for transmission at the antennas. Radio-frequency signals received from the antennas are down-converted to baseband signals and fed through a baseband filter prior to being received by the baseband processor. Such baseband filter is often implemented using an inductor having a large parasitic capacitance. If care if not taken, the large parasitic capacitance of the inductor can exhibit a self-resonance frequency that limits the bandwidth of baseband filter.

SUMMARY

An electronic device may include wireless circuitry. The wireless circuitry may include one or more processors configured to generate digital (baseband) signals, transceiver circuitry for modulating (up-converting) the baseband signals to radio-frequency signals, and one or more antennas for radiating the radio-frequency signals. A radio-frequency front end module may be coupled between the transceiver circuitry and the antenna(s). The transceiver circuitry may include a differential LC filter circuit. The LC filter circuit may be a low-pass filter or a notch filter configured to filter the baseband signals. The LC filter circuit may include large series inductors and feedforward capacitors that are cross-coupled with the series inductors and configured to partially or fully cancel the parasitic capacitance associated with the large series inductors.

An aspect of the disclosure provides a filter circuit that includes a first inductor having a first terminal coupled to a first input port of the filter circuit and having a second terminal coupled to a first output port of the filter circuit, a second inductor having a first terminal coupled to a second input port of the first circuit and having a second terminal coupled to a second output port of the filter circuit, a first feedforward capacitor having a first terminal coupled to the first terminal of the first inductor and having a second terminal coupled to the second terminal of the second inductor, and a second feedforward capacitor having a first terminal coupled to the first terminal of the second inductor and having a second terminal coupled to the second terminal of the first inductor. The filter circuit can include a first parallel capacitor having a first terminal coupled to the first terminal of the first inductor and having a second terminal coupled to the first terminal of the second inductor, and a second parallel capacitor having a first terminal coupled to the second terminal of the first inductor and having a second terminal coupled to the second terminal of the second inductor. The filter circuit can be a $3^{rd}$ order, $5^{th}$ order, or higher order differential LC filter. The first and second inductors can have the same inductance value. The feedforward capacitors can have a capacitance value that is equal to or less than a parasitic capacitance of the first and second inductors. The feedforward capacitors may be adjustable.

An aspect of the disclosure provides a filter circuit that includes a first series inductor coupled between a differential input and a differential output of the filter circuit, a second series inductor coupled between the differential input and the differential output of the filter circuit, and a first capacitance neutralization capacitor cross-coupled with the first and second series inductors, the first capacitance neutralization capacitor being configured to at least partially or fully cancel a parasitic capacitance associated with the first series inductor. The filter circuit can further include a second capacitance neutralization capacitor cross-coupled with the first and second series inductors, the second capacitance neutralization capacitor being configured to at least partially or fully cancel a parasitic capacitance associated with the second series inductor. The filter circuit can include an input capacitor coupled to the differential input of the filter circuit and an output capacitor coupled to the differential output of the filter circuit.

An aspect of the disclosure provides an electronic device that includes one or more processors configured to generate baseband signals and a differential filter configured to filter the baseband signals. The filter can include a first series inductor coupled between an input and an output of the differential filter, a second series inductor coupled between the input and the output of the differential filter, and a plurality of inductor self resonance mitigation capacitors cross-coupled with the first and second series inductors. The plurality of self resonance mitigation capacitors can have capacitance values designed to eliminate a self-resonant frequency associated with the first and second series inductors. Alternatively, the plurality of self resonance mitigation capacitors can have capacitance values designed or adjusted to tune a notch frequency of the differential filter.

DETAILED DESCRIPTION

Figure 1:
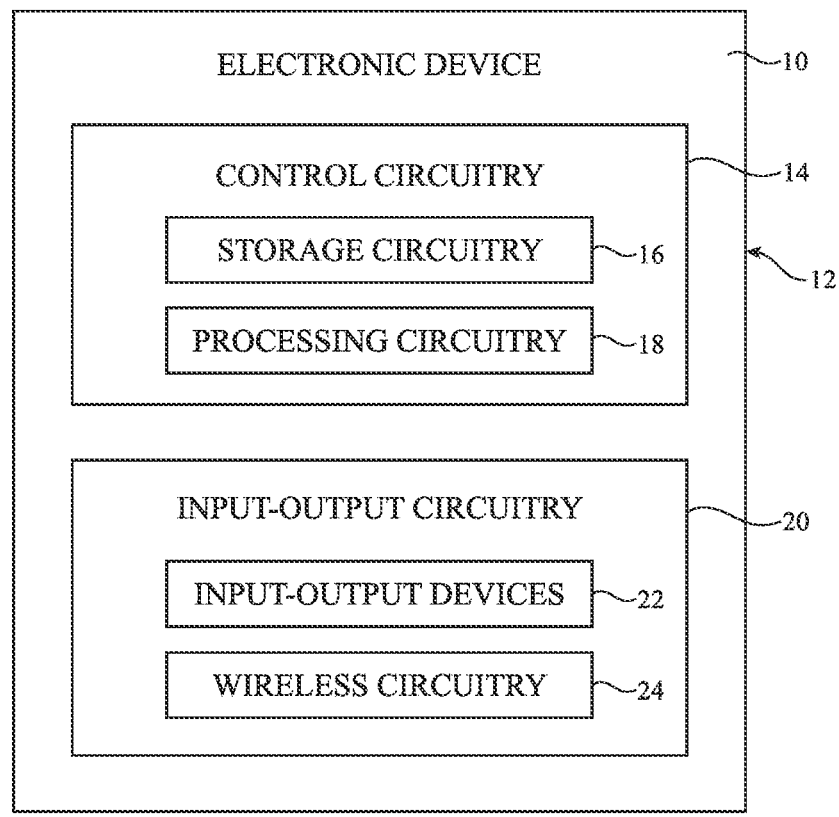
FIG. 1 is a diagram of an illustrative electronic device having wireless circuitry in accordance with some embodiments.

An electronic device such as an electronic device 10 of FIG. 1 may include a differential filter circuit. The differential filter circuit may be an LC filter (i.e., a filter that includes inductors and capacitors). The differential LC filter may be a low-pass filter such as a baseband filter (as an example). The differential LC filter may include a first series inductor coupled between a first input port and a first output port of the LC filter, a second series inductor coupled between a second input port and a second output port of the LC filter, an input capacitor coupled between the first and second input ports of the LC filter, and an output capacitor coupled between the first and second output ports of the LC filter.

The first and second series inductors can exhibit a self-resonance frequency that can adversely impact the frequency response of the LC filter. The self-resonance frequency of the series inductors is due to large parasitic capacitance of the series inductors. To mitigate this effect, the LC filter can be provided with a first feedforward capacitor coupled between the first input port and the second output port of the LC filter and a second feedforward capacitor coupled between the second input port and the first output port of the LC filter. Configured in this way, the first and second feedforward (cross-coupled) capacitors can at least partially cancel out the parasitic capacitance of the series inductors to mitigate the self-resonance effect or to fine tune the frequency response of the LC filter.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
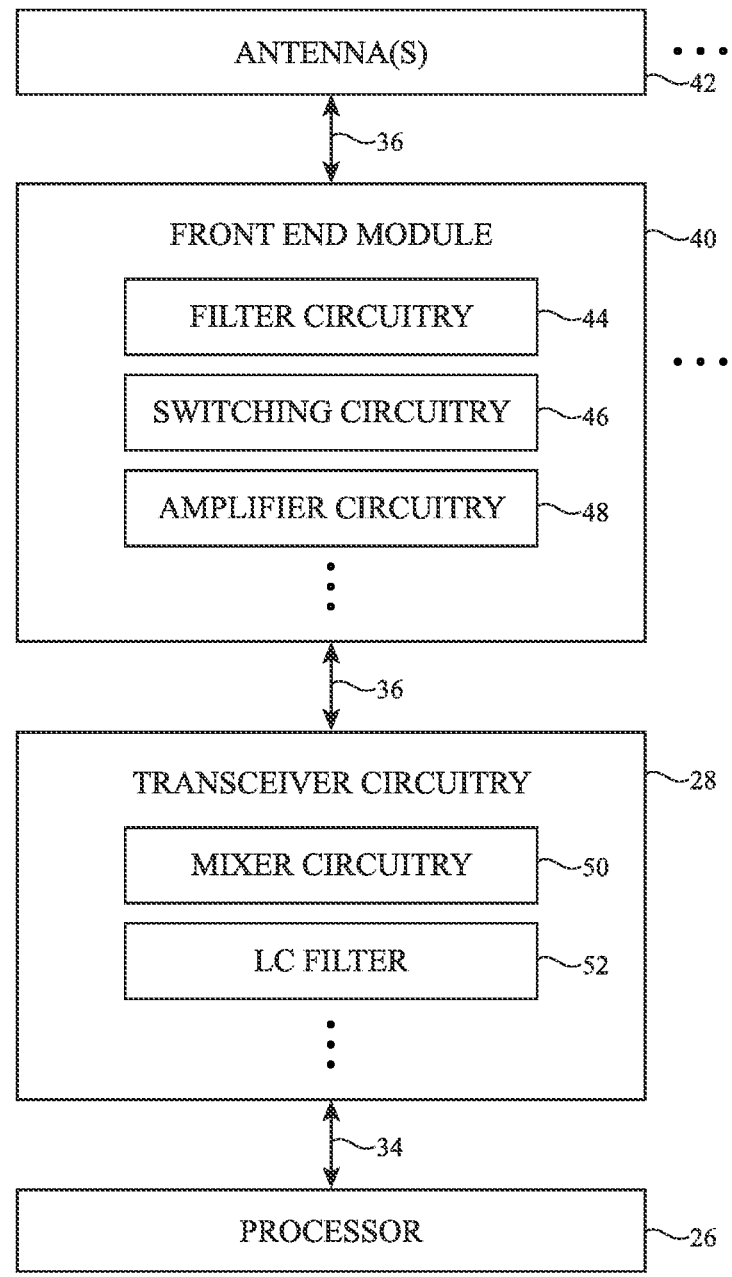
FIG. 2 is a diagram of illustrative wireless circuitry having filter circuitry in accordance with some embodiments.

FIG. 2 is a diagram showing illustrative components within wireless circuitry 24. As shown in FIG. 2, wireless circuitry 24 may include one or more processors such as processor 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, an application processor, a digital signal processor, a microcontroller, a microprocessor, a central processing unit (CPU), a programmable device, a combination of these circuits, and/or one or more processors within circuitry 18. Processor 26 may be configured to generated digital (baseband) signals.

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 36, any desired number of front end modules 40, and any desired number of antennas 42. Each processor 26 may be coupled to one or more transceivers 28 over respective baseband paths 34. Each transceiver 28 may include a transmitter circuit configured to output uplink signals to antenna 42, may include a receiver circuit configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module.

Processor 26 may be coupled to transceiver 28 over baseband path 34. Transceiver 28 may be coupled to antenna 42 via radio-frequency transmission line path 36. Radio-frequency front end module 40 may be disposed on radio-frequency transmission line path 36 between transceiver 28 and antenna 42. Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is merely illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards.

Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

Front end module (FEM) 40 may include radio-frequency front end circuitry that operates on the radio-frequency signals conveyed (transmitted and/or received) over radio-frequency transmission line path 36. Front end module 40 may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifiers and one or more low-noise amplifiers), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip or on separate integrated circuit chips.

Filter circuitry 44, switching circuitry 46, amplifier circuitry 48, and other circuitry may be disposed on radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front end module 40. For example, transceiver 28 may be formed on another substrate such as the main logic board of device 10, a rigid printed circuit board, or flexible printed circuit that is not a part of front end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, processor 26 and/or portions of transceiver 28 (e.g., a host processor on transceiver 28) may form a part of control circuitry 14. Control circuitry 14 (e.g., portions of control circuitry 14 formed on processor 26, portions of control circuitry 14 formed on transceiver 28, and/or portions of control circuitry 14 that are separate from wireless circuitry 24) may provide control signals (e.g., over one or more control paths in device 10) that control the operation of front end module 40.

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio (NR) Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/ or any other desired radio-frequency transceiver circuitry for covering any other desired communications bands of interest.

In performing wireless transmission, processor 26 may provide baseband signals to transceiver 28 over baseband path 34. Transceiver 28 may further include circuitry for converting the baseband signals received from baseband processor 26 into corresponding radio-frequency signals. For example, transceiver circuitry 28 may include mixer circuitry 50 for up-converting (or modulating) the baseband signals to intermediate frequencies or radio frequencies prior to transmission over antenna 42. Transceiver circuitry 28 may also include digital-to-analog converter (DAC) and/or analog-to-digital converter (ADC) circuitry for converting signals between digital and analog domains. Transceiver 28 may include a transmitter component to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from external wireless equipment. The received radio-frequency signals may be conveyed to transceiver 28 via radio-frequency transmission line path 36 and front end module 40. Transceiver 28 may include circuitry for converting the received radio-frequency signals into corresponding baseband signals. For example, transceiver 28 may use mixer circuitry 50 for down-converting (or demodulating) the received radio-frequency signals to intermediate frequencies or baseband frequencies prior to conveying the received signals to processor 26 over baseband path 34.

Transceiver 28 may further include a filter circuit such as an LC filter 52. An LC filter may be defined as a filter that includes inductive components and capacitive components. In some embodiments, filter 52 may be a low-pass filter that operates on baseband signals and is therefore sometimes referred to as a baseband filter. This is merely illustrative. Filter 52 can represent any type of filter (e.g., a low-pass filter, a notch filter, a band-pass filter, a high-pass filter, an antialiasing filter, or other types of filtering circuits). Although filter 52 is shown as being part of transceiver 28, filter 52 can be formed separate from transceiver 28 as part of front end module 40, as a separate component on baseband path 34, as a separate component on radio-frequency transmission line path 36, as part of processor 26, as part of antenna 42, or as part of another portion of wireless circuitry 24.

LC filter 52 may include one or more inductors coupled between input and output ports of the filter. To provide sufficient out-of-band rejection capabilities, each inductor within filter 52 is oftentimes large. For example, each inductor within LC filter 52 can be at least 1 nH or more (nanohenry), at least 0.1 nH or more, at least 5 nH or more, at least 10 nH or more, 1-10 nH, 10-20 nH, at least 20 nH or more, 20-30 nH, at least 30 nH or more, 30-50 nH, 50-100 nH, or more than 100 nH. If care is not taken, such large inductors may exhibit self resonance at a self-resonant frequency that can alter the desired frequency response of the LC filter. The self-resonant frequency of an inductor is the frequency at which a parasitic (intrinsic) capacitance associated with the inductor resonates with the ideal inductance of the inductor to create an extremely high impedance, causing the inductor to behave like an open circuit.

Figure 3:
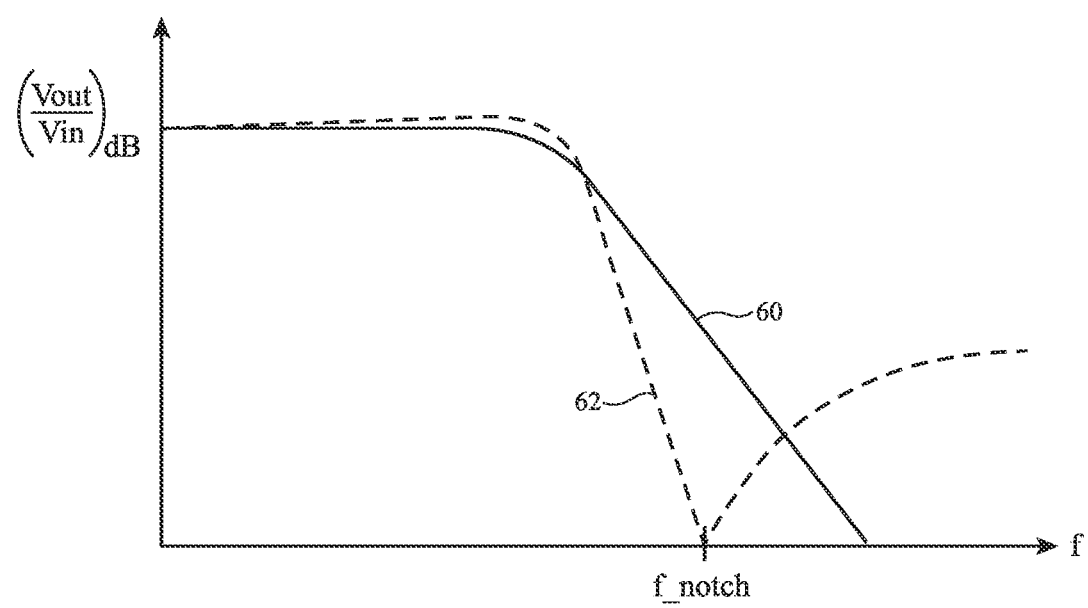
FIG. 3 is a plot illustrating the frequency response of a low-pass filter with and without feedforward capacitance in accordance with some embodiments.

In one embodiment, LC filter 52 might be designed to operate as a low-pass filter circuit. FIG. 3 is a plot illustrating the frequency response of low-pass filter 52. The y-axis of the plot represents a ratio of the output voltage Vout of filter 52 divided by the input voltage Vin of filter 52 (in dB scale), whereas the x-axis of the plot represents frequency. As shown in FIG. 3, curve 60 represents an ideal low-pass frequency response of filter 52 if the self resonance of the inductors within filter 52 did not exist or was mitigated. Curve 62 represents an altered frequency response of filter 52 with a steeper roll off due to the large self resonance of the inductors within filter 52, if the self resonance was not mitigated. In other words, the self resonance might change the frequency response of filter 52 from a low-pass response to a notch response having a notch frequency f notch, where f notch is a function of the self-resonant frequency. This change in frequency response (e.g., the steeper roll off or the reduced out-of-band rejection at higher frequencies caused by the notch) may or may not be desirable.

Figure 4:
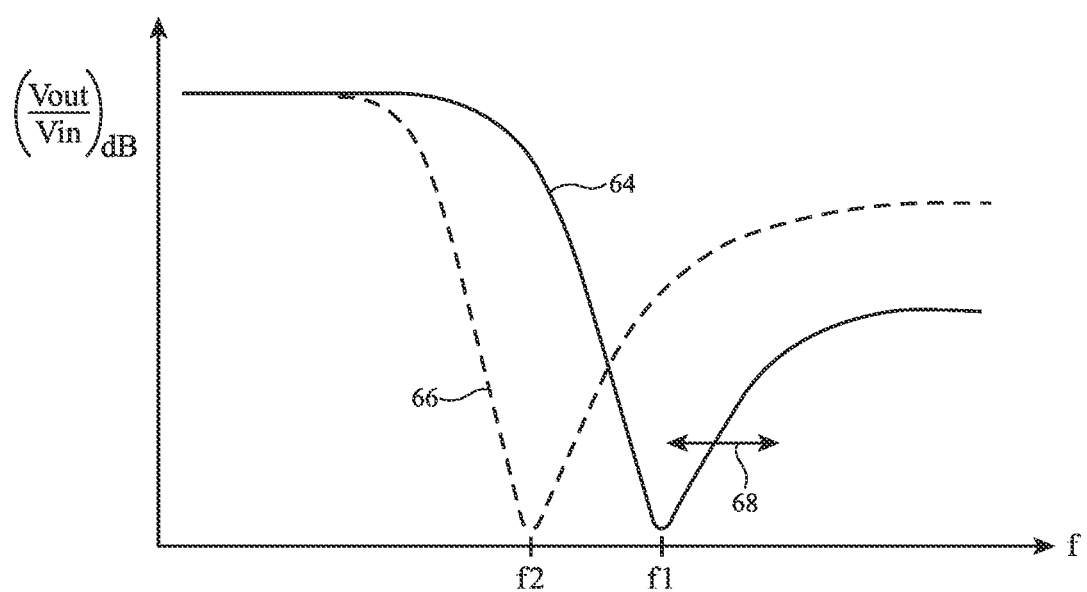
FIG. 4 is a plot illustrating the frequency response of a notch filter with and without feedforward capacitance in accordance with some embodiments.

In another embodiment, LC filter 52 might be designed to operate as a notch filter circuit. FIG. 4 is a plot illustrating the frequency response of notch filter 52. Similar to FIG. 3, the y-axis of the plot represents a ratio of the output voltage Vout of filter 52 divided by the input voltage Vin of filter 52 (in dB scale), whereas the x-axis of the plot represents frequency. As shown in FIG. 4, curve 64 represents an ideal notch frequency response of filter 52 if the self resonance of the inductors within filter 52 did not exist or was mitigated. Curve 64 has a notch frequency f1. A filter of this type configured to pass some frequencies while attenuating signals within a specific frequency range around a notch frequency is sometimes referred to as a band-stop filter or a band-rejection filter. Curve 66 represents an altered frequency response of filter 52 having a lower notch frequency f2 due to the large self resonance of the inductors within filter 52, if the self resonance was not mitigated. Notch frequency f1 may be a function of the self-resonant frequency. This change in frequency response (e.g., the reduction or change in the notch frequency placement due to the inductors' self resonance) may or may not be desirable.

Figure 5:
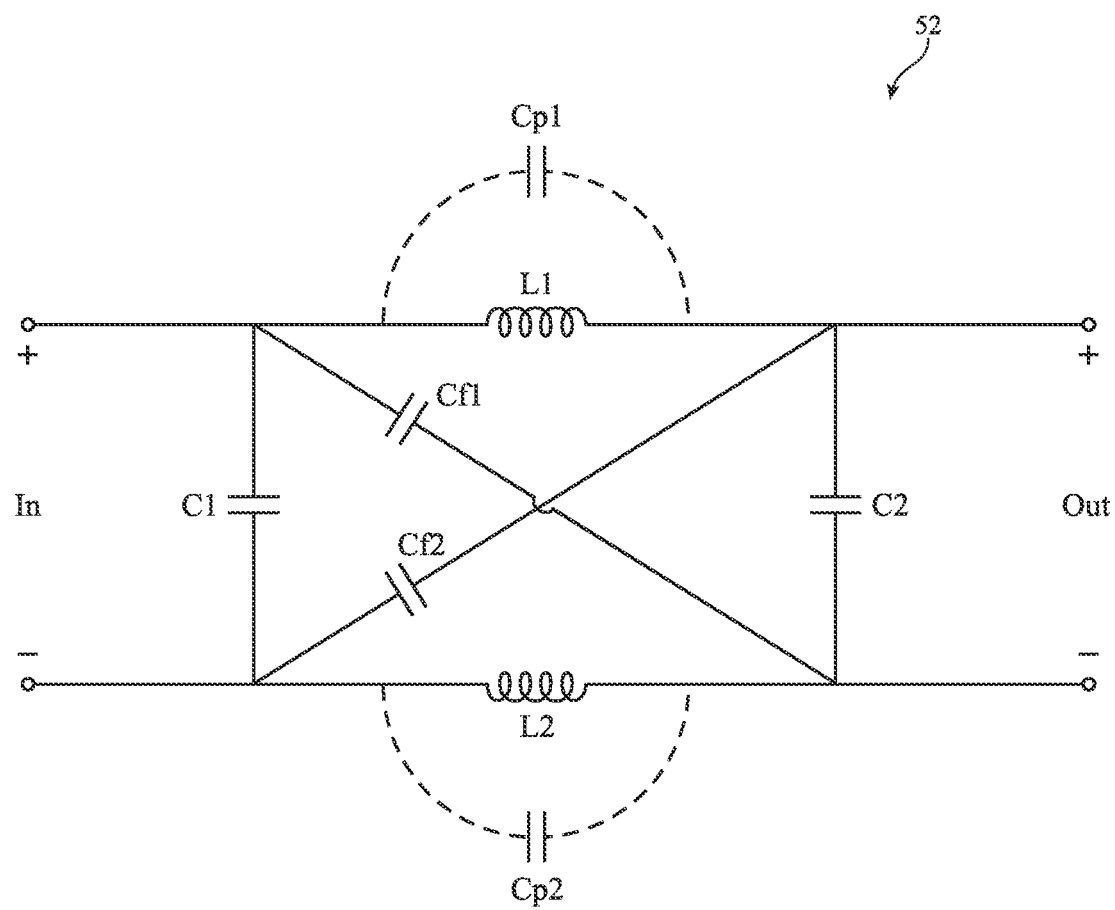
FIG. 5 is a circuit diagram of an illustrative differential LC filter having feedforward capacitance in accordance with some embodiments.

In accordance with an embodiment, LC filter 52 may be provided with feedforward capacitance configured to at least partially cancel out the self-resonance inducing parasitic capacitance associated with the large inductors within filter 52. FIG. 5 is a circuit diagram of an illustrative differential LC filter circuit 52. As shown in FIG. 5, filter 52 may include at least a first inductor L1, a second inductor L2, an input capacitor C1, and an output capacitor C2. Inductor L1 may have a first terminal coupled to a first (+) input port of filter 52 and may have a second terminal coupled to a first (+) output port of filter 52. Inductor L2 may have a first terminal coupled to a second (−) input port of filter 52 and may have a second terminal coupled to a second (−) output port of filter 52. Inductors L1 and L2 that are coupled in series between the input and output ports of filter 52 may sometimes be referred to as series inductors. The first and second input ports serve as a differential input for filter 52. The first and second output ports serve as a differential output for filter 52. LC filter 52 configured in this way is a differential circuit.

Inductors L1 and L2 may have large inductance values (e.g., at least 1 nH or more (nanohenry), at least 0.1 nH or more, at least 5 nH or more, at least 10 nH or more, 1-10 nH, 10-nH, at least 20 nH or more, 20-30 nH, at least 30 nH or more, 30-50 nH, 50-100 nH, or more than 100 nH). Inductor L1 may have an associated parasitic (intrinsic) capacitance Cp1, whereas inductor L2 may have an associated parasitic (intrinsic) capacitance Cp2. The parasitic capacitance Cp1 and Cp2 of these large series inductors can lead to undesired self resonance effects that limit the performance of filter 52.

To help mitigate or offset the effects of self resonance, differential LC filter 52 may be provided with feedforward capacitance (see, e.g., capacitors Cf1 and Cf2). Feedforward capacitor Cf1 may have a first terminal coupled to the first terminal of series inductor L1 and a second terminal coupled to the second terminal of series inductor L2. Feedforward capacitor Cf2 may have a first terminal coupled to the first terminal of series inductor L2 and a second terminal coupled to the second terminal of series inductor L1. Capacitors Cf1 and Cf2 that are cross-coupled between the input and output ports of filter 52 in this way are therefore sometimes referred to as cross-coupled or cross-coupling capacitors.

The use of cross-coupled capacitors Cf1 and Cf2 can effectively neutralize or cancel the parasitic capacitance of the series inductors. In some embodiments, the capacitance value of capacitors Cf1 and Cf2 can be set equal to the value of parasitic capacitance Cp1 and Cp2 (e.g., Cf1=Cp1, and Cf2=Cp2). In such scenarios, the self resonance of the series inductors can be entirely eliminated such that the frequency response of filter 52 is the expected low-pass filter response without any self-resonant flyback (e.g., so that the frequency response is like curve 60 and not curve 62 as shown in FIG. 3). Capacitors Cf1 and Cf2 are therefore sometimes referred to as capacitance cancelling (neutralization) capacitors or inductor self resonance mitigation capacitance.

The example above where capacitors Cf1 and Cf2 completely cancels out the parasitic capacitance of the series inductors is merely illustrative. In other embodiments, the use of cross-coupled capacitors Cf1 and Cf2 can partially neutralize or partially cancel out the parasitic capacitance associated with the series inductors. To accomplish this, the capacitance value of capacitors Cf1 and Cf2 may be less than the value of the parasitic capacitance Cp1 and Cp2 (e.g., Cf1<Cp1, and Cf2<Cp2). For example, the feedforward capacitance may be at least 90% of the parasitic capacitance, at least 80% of the parasitic capacitance, at least 70% of the parasitic capacitance, at least 60% of the parasitic capacitance, at least 50% of the parasitic capacitance, up to 99% of the parasitic capacitance, 50-99% of the parasitic capacitance, 90-99% of the parasitic capacitance, 80-99% of the parasitic capacitance, 70-99% of the parasitic capacitance, 1-50% of the parasitic capacitance, or other fraction of the parasitic capacitance. In such scenarios, the self resonance of the series inductors is only partially offset, so the frequency response of filter 52 can have a notch frequency f1 as shown by curve 64 in FIG. 4. The amount or degree of cancellation can determine the exact placement of frequency f1. In other words, the value of the feedforward capacitance can be specifically chosen to tune or adjust the desired notch frequency of filter 52 (see adjustment window 68 in FIG. 4).

Capacitors Cf1 and Cf2 can be implemented using any type of capacitors. As an example, the feedforward capacitors can be metal-oxide-metal (MOM) capacitors. As another example, the feedforward capacitors can be metal-insulator-metal (MIM) capacitors. As another example, the feedforward capacitors can be metal-oxide-semiconductor (MOS) capacitors. As another example, the feedforward capacitors can be varactor diode components. If desired, the feedforward capacitance may be implemented using any suitable integrated circuit capacitive structure.

Figure 6:
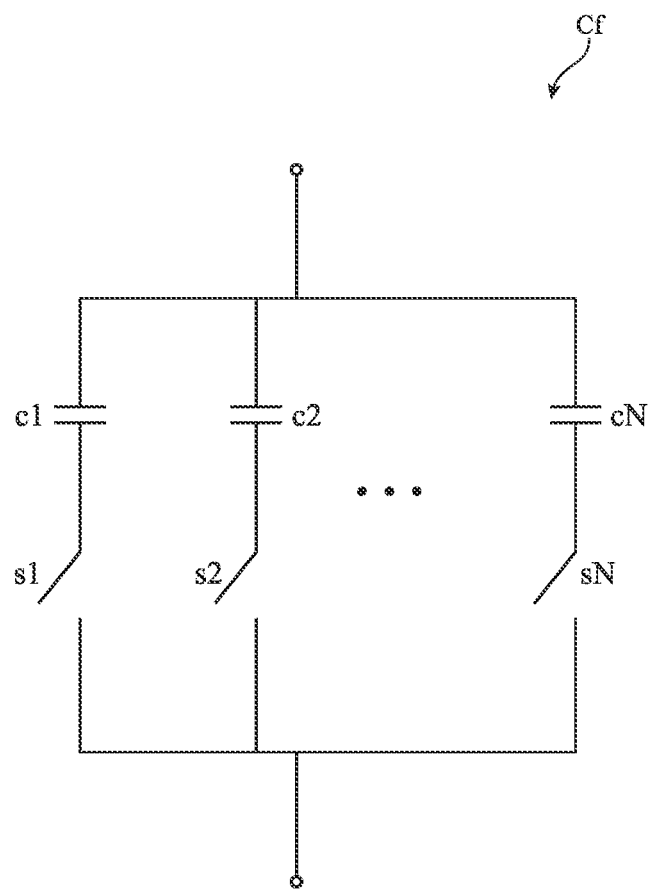
FIG. 6 is a circuit diagram of illustrative adjustable capacitance in accordance with some embodiments.

Capacitors Cf1 and Cf2 can be adjustable capacitance. FIG. 6 is a diagram of an adjustable feedforward capacitance Cf, which can represent capacitor Cf1 and/or Cf2. As shown in FIG. 6, capacitance Cf can include an array (bank) of capacitors c1, c2, ..., and cN. Each capacitor in the array of capacitors can be selectively activated (or deactivated) using a respective switch. For example, capacitor c1 can be switched into use by turning on corresponding switch s1; capacitor c2 can be switched into use by turning on corresponding switch s2; ...; and capacitor cN can be switched into use by turning on corresponding switch sN. There can be any number of capacitors and switches within adjustable capacitance Cf (e.g., N can represent any integer value). The values (size) of the various capacitors c1-cN in the array can be the same or can be different (e.g., capacitors c1-cN can be binary weighted). By selectively turning on and off switches s1-sN, the value of capacitance Cf can be adjusted to entirely cancel out the parasitic capacitance of the series inductor or to partially mitigate the parasitic capacitance of the series inductor to tune the desired notch frequency of filter 52.

Figure 7:
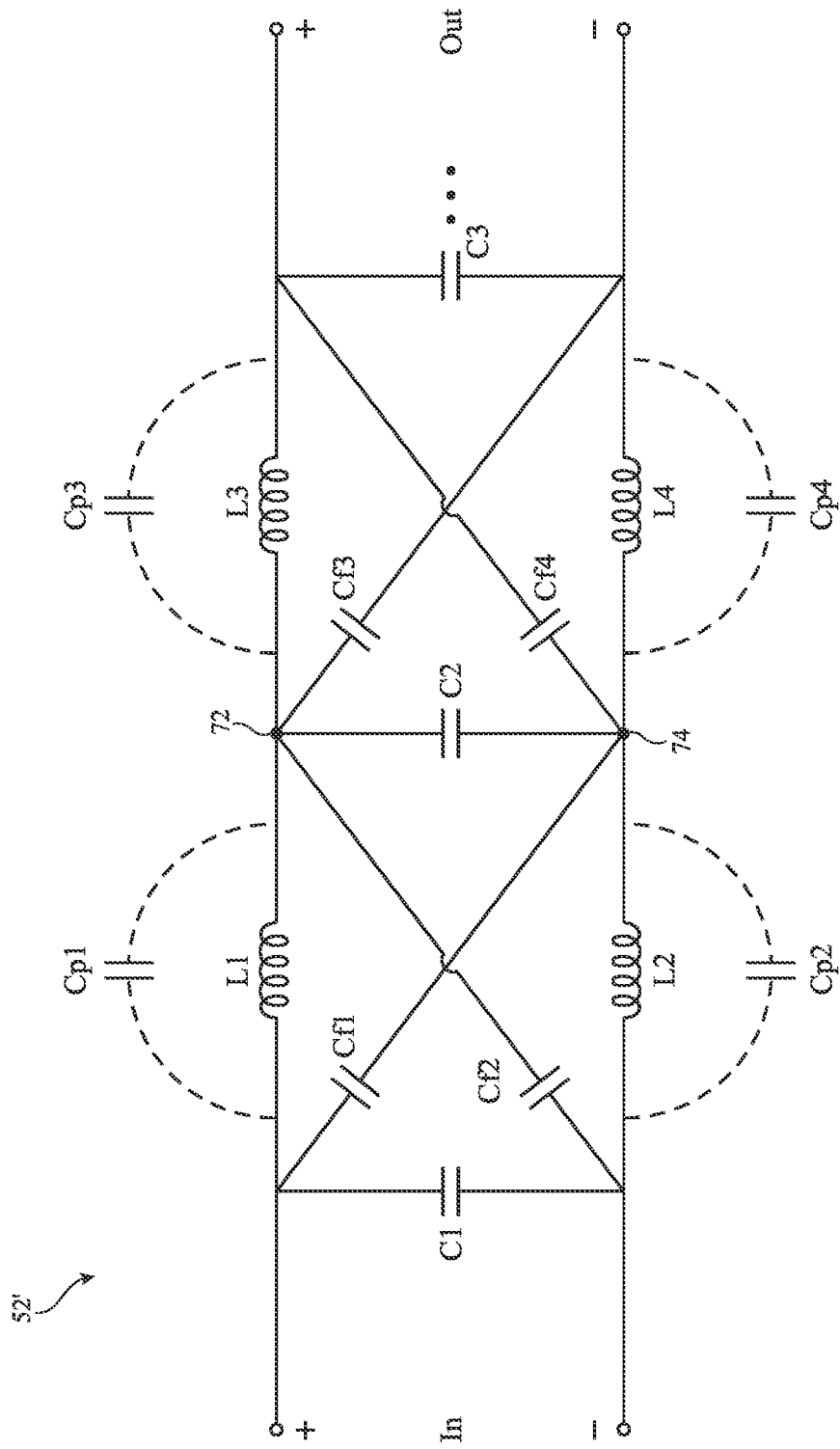
FIG. 7 is a circuit diagram of an illustrative $5^{th}$ order differential LC filter having feedforward capacitance in accordance with some embodiments.

The exemplary LC filter 52 of FIG. 5 having a pair of series inductors coupled between the differential input and output is sometimes referred to as a $3^{rd}$ order differential LC filter. This is merely illustrative. In general, the disclosed technique of using feedforward capacitance to at least partially or fully cancel out the parasitic capacitance of the series inductors can be applied to LC filters of any order. FIG. 7 is an example of a $5^{th}$ order differential LC filter 52' having four parasitic capacitance neutralization capacitors. As shown in FIG. 7, filter 52' may include series inductors L1-L4, parallel capacitors C1-C3, and feedforward capacitors Cf1-Cf4. Inductors L1 and L2 may generally have the same inductance value. Capacitors Cf1 and Cf2 may therefore also have the same capacitance values (as an example). Inductors L3 and L4 may generally have the same inductance value. Inductors L1 and L3, however, can have the same or different inductance values.

Inductor L1 has a first terminal coupled to a first (+) input port of filter 52' and a second terminal coupled to a first intermediate node 72. Inductor L2 has a first terminal coupled to a second (−) input port of filter 52' and a second terminal coupled to a second intermediate node 74. The first and second input ports serve collectively as a differential input for filter 52'. Capacitor C1 is coupled in parallel between the first and second input ports and is therefore sometimes referred to as an input capacitor. Capacitor C2 is coupled in parallel between nodes 72 and 74. Feedforward capacitor Cf1 may have a first terminal coupled to the first input port and a second terminal cross-coupled to node 74. Feedforward capacitor Cf2 may have a first terminal coupled to the second input port and a second terminal cross-coupled to node 72. Capacitors Cf1 and Cf2 cross-coupled in this way can be used to at least partially cancel or fully cancel out the parasitic capacitance Cp1 and Cp2 associated with inductors L1 and L2.

Inductor L3 has a first terminal coupled to node 72 and a second terminal coupled to a first (+) output port of filter 52'. Inductor L4 has a first terminal coupled to node 74 and a second terminal coupled to a second (−) output port of filter 52'. The first and second output ports serve collectively as a differential output for filter 52'. Capacitor C3 is coupled in parallel between the first and second output ports and is therefore sometimes referred to as an output capacitor. Feedforward capacitor Cf3 may have a first terminal coupled to node 72 and a second terminal cross-coupled to the second output port of filter 52'. Feedforward capacitor Cf4 may have a first terminal coupled to node 74 and a second terminal coupled to to the first output port of filter 52'. Capacitors Cf3 and Cf4 cross-coupled in this way can be used to at least partially cancel or fully cancel out the parasitic capacitance Cp3 and Cp4 associated with inductors L3 and L4.

The example of FIG. 7 of $5^{th}$ order differential LC filter 52' having inductor self resonance mitigating capacitance Cf1-Cf4 is merely illustrative. In general, the use of self resonance mitigation capacitance can be applied to differential LC filters of any order (e.g., to $7^{th}$ order LC filters, to $9^{th}$ order LC filters, or to even higher order LC filters).

The foregoing is merely illustrative and various modifications can be made to the described embodiments. The foregoing embodiments may be implemented individually or in any combination.

What is claimed is:

1. A filter circuit comprising:
    a first inductor having a first terminal coupled to a first input port of the filter circuit and having a second terminal coupled to a first output port of the filter circuit;
    a second inductor having a first terminal coupled to a second input port of the first circuit and having a second terminal coupled to a second output port of the filter circuit;
    a first feedforward capacitor having a first terminal coupled to the first terminal of the first inductor and having a second terminal coupled to the second terminal of the second inductor;
    a second feedforward capacitor having a first terminal coupled to the first terminal of the second inductor and having a second terminal coupled to the second terminal of the first inductor; and
    a parallel capacitor coupled across the first terminals of the first and second inductors.

2. The filter circuit of claim 1, wherein the first and second feedforward capacitors comprise adjustable capacitance.

3. The filter circuit of claim 1, further comprising an additional parallel capacitor having a first terminal coupled to the second terminal of the first inductor and having a second terminal coupled to the second terminal of the second inductor.

4. The filter circuit of claim 1 having a notch frequency that is based on capacitance values of the first and second feedforward capacitors.

5. The filter circuit of claim 1, further comprising:
    a third inductor having a first terminal coupled to the second terminal of the first inductor and having a second terminal coupled to the first output port of the filter circuit; and
    a fourth inductor having a first terminal coupled to the second terminal of the second inductor and having a second terminal coupled to the second output port of the filter circuit.

6. The filter circuit of claim 5, further comprising:
    a third feedforward capacitor having a first terminal coupled to the first terminal of the third inductor and having a second terminal coupled to the second terminal of the fourth inductor; and
    a fourth feedforward capacitor having a first terminal coupled to the first terminal of the fourth inductor and having a second terminal coupled to the second terminal of the third inductor.

7. The filter circuit of claim 6, further comprising:
    a first additional parallel capacitor having a first terminal coupled to the second terminal of the first inductor and having a second terminal coupled to the second terminal of the second inductor; and a second additional parallel capacitor having a first terminal coupled to the second terminal of the third inductor and having a second terminal coupled to the second terminal of the fourth inductor.

8. The filter circuit of claim 1, wherein the first inductor has a given inductance value and wherein the second inductor has the given inductance value.

9. The filter circuit of claim 1, wherein the first and second inductors each have an inductance value greater than 5 nH.

10. The filter circuit of claim 1, wherein the first feedforward capacitor has a capacitance value that is equal to a parasitic capacitance of the first inductor and wherein the second feedforward capacitor has a capacitance value that is equal to a parasitic capacitance of the second inductor.

11. The filter circuit of claim 1, wherein the first feedforward capacitor has a capacitance value that is less than a parasitic capacitance of the first inductor and wherein the second feedforward capacitor has a capacitance value that is less than a parasitic capacitance of the second inductor.

12. A filter circuit comprising:
- a first series inductor coupled between a differential input and a differential output of the filter circuit;
- a second series inductor coupled between the differential input and the differential output of the filter circuit;
- a first capacitance neutralization capacitor cross-coupled with the first and second series inductors, the first capacitance neutralization capacitor being configured to at least partially cancel a parasitic capacitance associated with the first series inductor; and
- an output capacitor coupled across the differential output of the filter circuit.

13. The filter circuit of claim 12, further comprising:
- a third series inductor coupled between the first series inductor and the differential output of the filter circuit;
- a fourth series inductor coupled between the second series inductor and the differential output of the filter circuit; and
- a plurality of capacitance neutralization capacitors cross-coupled with the third and fourth series inductors, the plurality of capacitance neutralization capacitors being configured to at least partially cancel parasitic capacitances associated with the third and fourth series inductors.

14. The filter circuit of claim 12, further comprising a second capacitance neutralization capacitor cross-coupled with the first and second series inductors, the second capacitance neutralization capacitor being configured to at least partially cancel a parasitic capacitance associated with the second series inductor.

15. The filter circuit of claim 14, wherein the first capacitance neutralization capacitor is configured to fully cancel the parasitic capacitance associated with the first series inductor and wherein the second capacitance neutralization capacitor is configured to fully cancel the parasitic capacitance associated with the second series inductor.

16. The filter circuit of claim 12, further comprising:
- an input capacitor coupled across the differential input of the filter circuit.

17. An electronic device comprising:
- one or more processors configured to generate baseband signals; and
- a differential filter configured to filter the baseband signals, the differential filter including
  - a first series inductor coupled between an input and an output of the differential filter,
  - a second series inductor coupled between the input and the output of the differential filter, and
  - a plurality of inductor self resonance mitigation capacitors cross-coupled with the first and second series inductors, wherein the differential filter has a notch frequency that is based on capacitance values of the plurality of inductor self resonance mitigation capacitors.

18. The electronic device of claim 17, further comprising:
- an input capacitor coupled across the input of the differential filter; and
- an output capacitor coupled across the output of the differential filter.

19. The electronic device of claim 17, wherein the plurality of self resonance mitigation capacitors have capacitance values chosen to eliminate a self-resonant frequency associated with the first and second series inductors.

* * * * *

UNITED STATES PATENT AND TRADEMARK OFFICE
CERTIFICATE OF CORRECTION

PATENT NO. : 11,909,370 B2
APPLICATION NO. : 17/831261
DATED : February 20, 2024
INVENTOR(S) : Milad Darvishi It is certified that error appears in the above-identified patent and that said Letters Patent is hereby corrected as shown below:

In the Claims

Column 12, Line 22, "the first circuit" should read -- the filter circuit --

Signed and Sealed this
Twenty-first Day of May, 2024

Katherine Kelly Vidal
*Director of the United States Patent and Trademark Office*